United States Patent
Xing et al.

[11] Patent Number: 5,880,026
[45] Date of Patent: Mar. 9, 1999

[54] METHOD FOR AIR GAP FORMATION BY PLASMA TREATMENT OF ALUMINUM INTERCONNECTS

[75] Inventors: Guoqiang Xing, Dallas; Kenneth D. Brennan, Flower Mound, both of Tex.

[73] Assignee: Texas Instruments Incorporated, Dallas, Tex.

[21] Appl. No.: 991,865

[22] Filed: Dec. 16, 1997

Related U.S. Application Data

[60] Provisional application No. 60/033,892 Feb. 23, 1996.
[51] Int. Cl.⁶ .................................................. H01L 23/48
[52] U.S. Cl. ...................... 438/688; 438/688; 438/619; 438/699; 438/671
[58] Field of Search ................................. 438/421, 422, 438/619, 699, 671, 688, 224, 225

[56] References Cited

U.S. PATENT DOCUMENTS

| | | | |
|---|---|---|---|
| 5,198,385 | 3/1993 | Devitt et al. | 438/619 |
| 5,308,440 | 5/1994 | Chino et al. | 438/619 |
| 5,708,303 | 1/1998 | Jeng | 257/758 |
| 5,759,913 | 6/1998 | Fulford, Jr. et al. | 438/422 |

*Primary Examiner*—Charles Bowers
*Assistant Examiner*—Thanh Nguyen
*Attorney, Agent, or Firm*—Mark A. Valetti; Carlton H. Hoel; Richard L. Donaldson

[57] ABSTRACT

An ultimate low k (k=1) gap structure for high speed logic devices in which the sidewalls fully or partially cover the gaps between the interconnects by dry etching the already formed aluminum interconnects after the photoresist has been stripped. This method is particularly useful for the subsequent deposition of silicon dioxide and for forming air gaps.

7 Claims, 2 Drawing Sheets

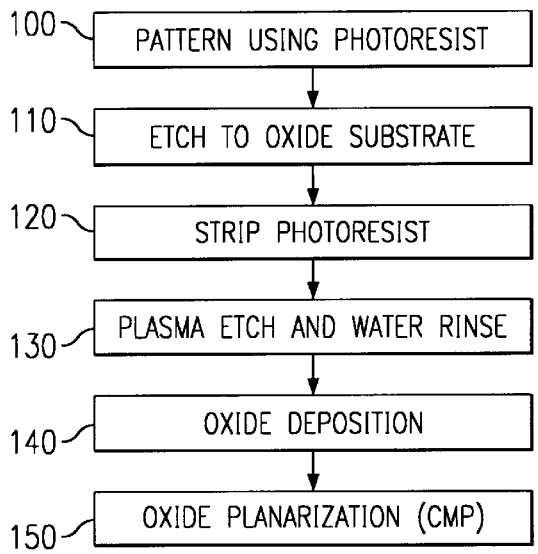
FIG. 1
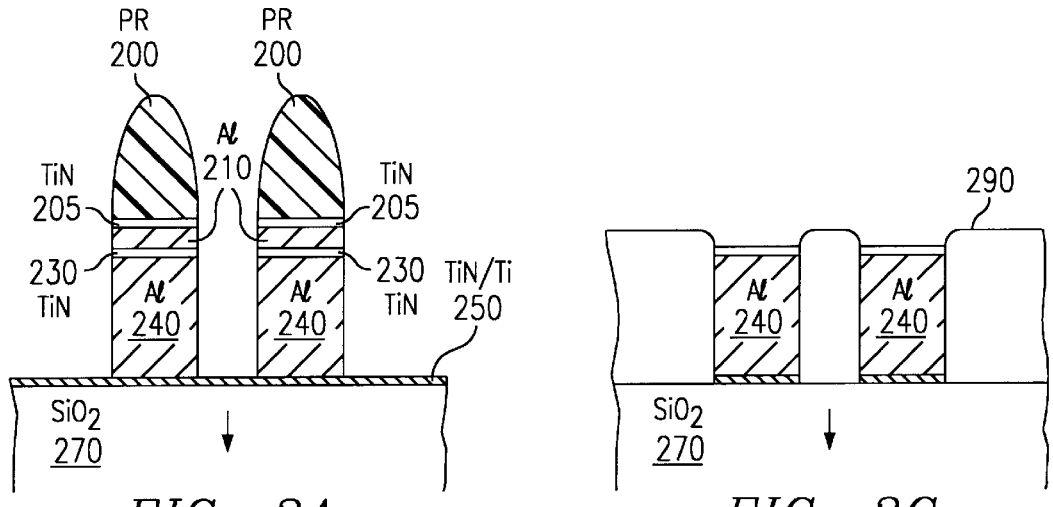
FIG. 2A
FIG. 2C
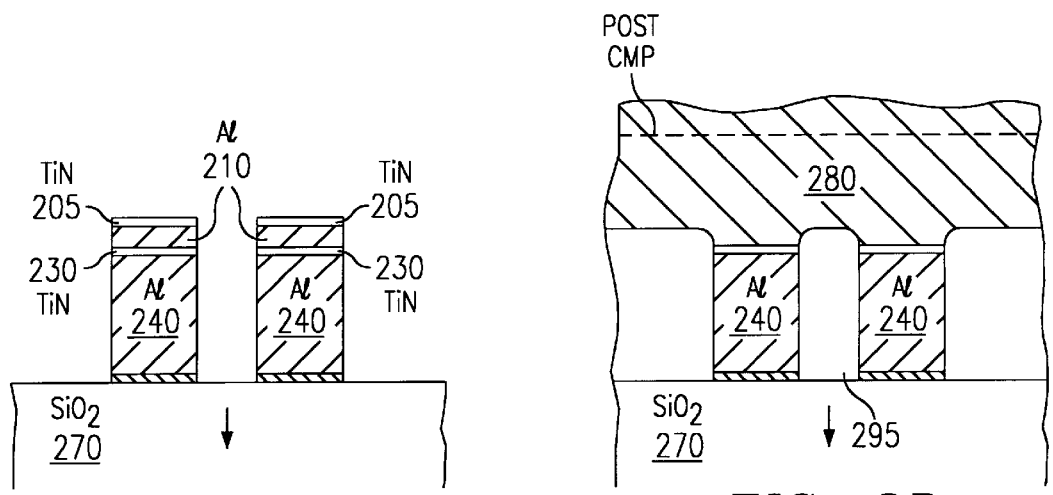
FIG. 2B
FIG. 2D

METHOD FOR AIR GAP FORMATION BY PLASMA TREATMENT OF ALUMINUM INTERCONNECTS

This application claims priority under 35 USC § 119(e)(1) of provisional application number 60/033,842 filed Dec. 23, 1996.

BACKGROUND AND SUMMARY OF THE INVENTION

The present invention relates to integrated circuit structures and fabrication methods.

Background: Parasitic Capacitance of Interconnects

The performance of current interconnect systems is becoming limited by the system interconnect delay. This is recognized as being a major unresolved challenge to the semiconductor industry. A major component of this delay results from intralevel capacitance. Parasitic capacitance of conductors hurts performance in at least two ways: first, the distributed capacitive load on wiring will slow down the propagation of signals. Secondly, the capacitive coupling between adjacent lines can cause "cross-talk," where a pulse on one line is coupled into an adjacent line. This can lead to unpredictable logic errors.

Parasitic capacitance can be reduced by using insulation with a lower dielectric constant k. Currently, low k dielectric materials (e.g. HSQ k=2.8; parylene 2.4; aerogel 1.7 etc.) are used for gap fill and inter-metal dielectrics.

Background: Step Coverage and Void Formation

FIGS. 4A–4C show how undesired voids can be accidentally formed in the prior art. Since deposition tends to be more rapid on the exposed edges 402 of adjacent lines 400, the thicker accumulations of material 410 deposited on these edges 402 can eventually meet to enclose a void 404. This has long been recognized as a problem.

Background: Air Bridge Structures

"Air bridge" structures have been used in the past in microwave circuits, to minimize vertical capacitive coupling where one line crosses over another. However, there has been no way to adapt this technology to reduce capacitance between very long parallel signal lines. Air bridges are discussed, for example, in the following references, all of which are hereby incorporated by reference: Tsai et al., "Multiple arbitrary shape via-hole and air-bridge transitions in multilayered structures," 1996 IEEE MTT-S *INTERNATIONAL MICROWAVE SYMPOSIUM DIGEST* vol.2, p.707–10 (1996); Villeneuve et al., "Air-bridge microcavities, " *APPLIED PHYSICS LETTERS*, vol.67, no.2, p. 167–9 (Jul. 10, 1995); and Goldfarb et al., "The effect of air bridge height on the propagation characteristics of microstrip," 1 IEEE *MICROWAVE AND GUIDED WAVE LETTERS* 273 (October 1991).

Innovative Structure and Method

The present application discloses an ultimate low k (k=1) gap structure for high speed logic devices in which the sidewalls fully or partially cover the gaps between the interconnects by dry etching the already formed aluminum interconnects after the photoresist has been stripped. The present application also discloses a particularly surprising method of fabricating lateral air gaps using the insulating sidewalls which normally form on conductors during anisotropic plasma etching. This is done by using a sacrificial layer on which the sidewall is formed, and then removing the sacrificial layer, so that residual mechanical stress will cause the free standing portion of the sidewall layer to curve outward from the patterned conductor layer. Adjacent lines of such curling sidewall material will then form arches, which provide a partial template for subsequent deposition of an insulator, such as silicon dioxide, which will encapsulate the air gap between the adjacent conductors.

The innovative structure and method of the present invention provides the following advantages:
- reduced parasitic capacitance between parallel conductors;
- no new equipment or process is required;
- better suited for narrower gaps;
- substantially no solid dielectric is formed on the sidewalls of the metal lines;
- air gap height is only slightly greater than that of the metal line, hence the interlevel dielectric layer thickness is not excessive; and
- air gap scales with reduction in metal pitch.

BRIEF DESCRIPTION OF THE DRAWING

The disclosed inventions will be described with reference to the accompanying drawings, which show important sample embodiments of the invention and which are incorporated in the specification hereof by reference, wherein:

FIG. 1 shows a process flow for air gap formation;

FIGS. 2A–2D shows the formation of air gap isolation during an integrated circuit fabrication method in accordance with a preferred embodiment of the present invention;

DETAILED DESCRIPTION OF THE PREFERRED EMBODIMENTS

Figure 3:
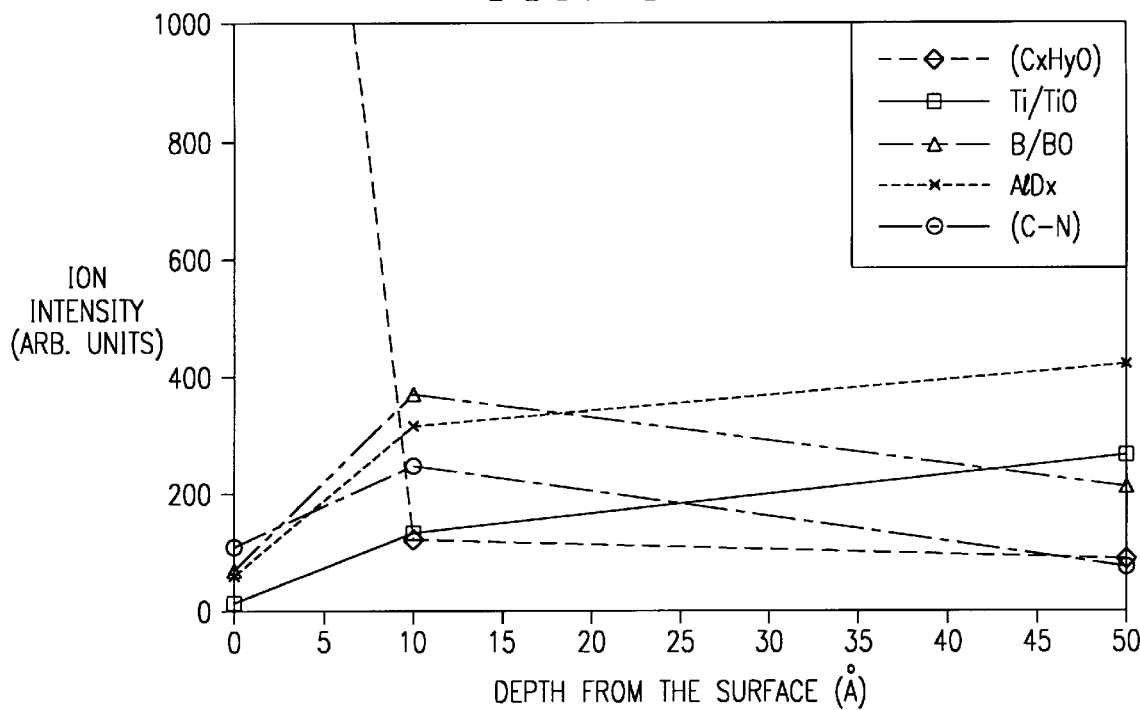
FIG. 3 shows characterization results on the structure of FIG. 2C.
Figure 4A:
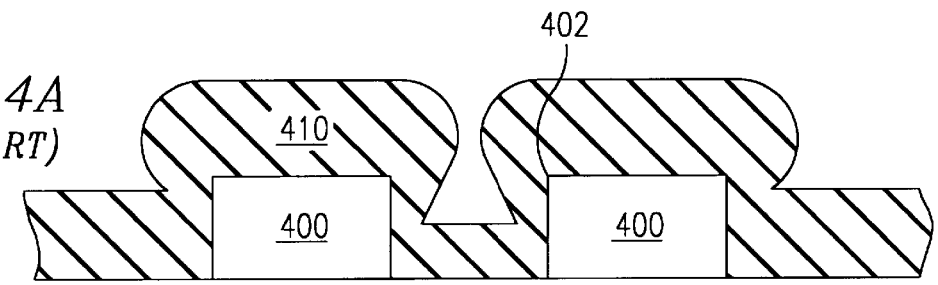
FIGS. 4A–4C show how undesired voids can be accidentally formed in the prior art.
Figure 4B:
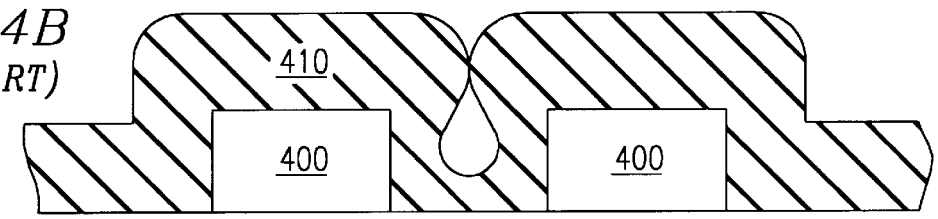
Figure 4C:
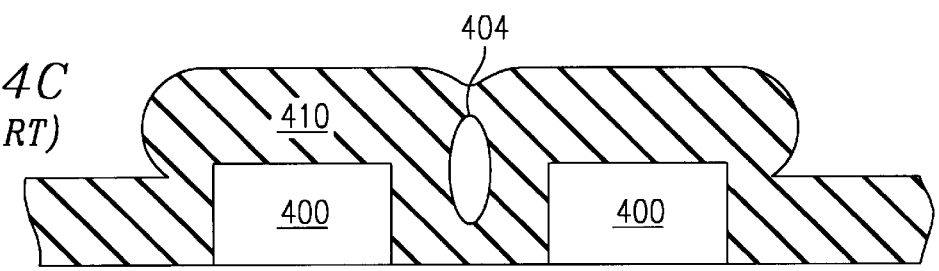

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

As device dimensions shrink, the spacing between lines shrinks and the aspect ratio increases. In accordance with embodiments of the present invention, air gaps are intentionally formed between closely n- spaced lines. The wafers are then capped with an insulating layer (e.g. SiO2) and chemical-mechanically polished to planarize the insulating layer. The end result is a localized air gap between the metal lines that reduces the parasitic capacitance between adjacent metal lines. The performance of this approach improves as dimensions shrink and aspect ratios increase.

Sample Embodiment: Separate Metal and Sacrificial Layers

FIG. 1 shows a process flow for forming air gaps and will be explained in conjunction with the cross-sectional diagrams showing one embodiment of the present invention in FIGS. 2A–2D. A sample partially fabricated integrated circuit structure, which typically includes a metal layer, such as aluminum, overlying an oxide layer, is patterned using photoresist 200 (step 100) prior to etching the structure to the underlying oxide 270 (step 110).

In the configuration of FIG. 2A, two layers of aluminum have been patterned together. The bottom layer of aluminum 240 is deposited on a barrier/adhesion layer 250 (e.g. TiN on Ti) which is formed over an underlying oxide layer 270. An intermediate TiN layer 230 separates the two aluminum layers 210 and 240; this layer provides an endpoint during etching of the aluminum layer 210, and improves the electromigration resistance of the interconnect 240. (Optionally a thin oxide layer can also be used to provide an etch stop between the layers 210 and 240, but this is less preferred.) The top sacrificial layer of aluminum 210 is then deposited. Finally, an antireflective coating (ARC) layer 205, such as TiN, is formed on the surface of the top layer of aluminum 210.

During the aluminum etch a C12/BC13/N2 chemistry is preferably used in order to form a more stable sidewall residue on the aluminum lines. (Anisotropic plasma etching of aluminum or other conductors normally forms a deposit on the sidewalls. In the case of aluminum, this will include aluminum oxides, boron oxides, and a significant fraction of carbon. The carbon and oxygen fractions are derived from erosion of the photoresist during the etch step. Ion bombardment prevents these materials from accumulating on the bottom of the exposed location, and therefore causes the etch to proceed anisotropically as desired.)

Subsequently, the photoresist 200 is stripped (step 120), as can be seen in FIG. 2B, and the structure is then plasma etched to remove the sacrificial layer 210 (but not the sidewall residues remaining from the previous etching step). A rinse in water is then performed (step 130). As shown in FIG. 2C, after the plasma etch and rinse, the remaining sidewall residues 290 of the aluminum interconnects have formed arches which curl toward each other from adjacent lines (due to the mechanical stress induced during the rinse step). These residues 290 are about 15 to 20 nm thick, in this sample embodiment. The height and angle of the arches can be easily controlled by varying the thickness of the top layer of aluminum 210 and by varying the water rinse process (step 130), e.g. by using a megasonic clean instead of the normal Quick Dump/Rinse.

Following this rinse step (step 130), a layer of oxide 280, typically SiO2, is deposited (step 140) over the structure. The partial arches formed by the sidewall residues 290 provide a template for this oxide deposition step to quickly close off the gaps between adjacent lines, resulting in air gaps 295 between the aluminum interconnects, as shown in FIG. 2D. (The air gaps 295 will contain low-pressure gasses corresponding to the gas mixture used for deposition of the oxide 280.) Where metal lines are not adjacent, this step will fill in the space beneath the curled sidewall residue with oxide.

The air gaps have a cross-sectional area which is at least 50 percent of the cross-sectional area of the metal lines (and more than 80% in the presently preferred embodiment). Furthermore, substantially no dielectric material (except for the sidewall residue) is present on the sidewalls of the metal lines, so that the effective capacitive loading presented to the metal lines is minimal. The layer of oxide is then planarized (step 150) using a chemical mechanical polishing (CMP) process, as shown in FIG. 2F.

The following data gives results from actual test runs using sample embodiments of the present invention. A stack containing a top layer of titanium nitride having a thickness around 50 nanometers, a layer of aluminum with 0.5 percent copper having a thickness approximately 560 nanometers, and a bottom layer of titanium nitride having a thickness around 50 nanometers was patterned with photoresist and etched to form the metal lines, followed by a plasma etch and rinse to form the arches of sidewall material.

| Air Gap Formation | |
| --- | --- |
| Aluminum Etch | |
| Reactor: | Applied Materials DPS Metal Etch Chamber |
| Dome Temperature: | 80 degrees C. |
| Cathode Temperature: | 45 degrees C. |
| Wafer Backside Helium: | 10 Torr |
| Step 1: Stabilization | |
| Bcl3 Source Flow: | 60 sccm |
| C12 Source Flow: | 40 sccm |
| N2 Source Flow: | 40 sccm |
| RF Power: | 0 W |
| Pressure: | 7 mTorr |
| Time: | 15 sec |
| Step 2: Aluminum Main Etch | |
| BC13 Source Flow: | 60 sccm |
| C12 Source Flow: | 40 sccm |
| N2 Source Flow: | 40 sccm |
| Top RF Power: | 500 W |
| Bottom Power: | 120 W |
| Pressure: | 7 mTorr |
| Time: | 52 sec (normal endpoint time) |
| Step 3: Aluminum Over Etch | |
| BC13 Source Flow: | 60 sccm |
| C12 Source Flow: | 40 sccm |
| N2 Source Flow: | 0 sccm |
| Top RF Power: | 500 W |
| Bottom Power: | 120 W |
| Pressure: | 7 mTorr |
| Time: | 60 seconds |
| Resist Strip | |
| Reactor: | Applied Materials ASP Strip Chamber |
| Temperature: | 240 degrees C. |
| Step 1: Passivation | |
| H2O Source Flow: | 500 sccm |
| Power: | 1400 W |
| Pressure: | 2 Torr |
| Time: | 50 sec |
| Step 2: Strip | |
| O2 Source Flow: | 3000 sccm |
| H2O Source Flow: | 300 sccm |
| N2 Source Flow: | 200 sccm |
| Power: | 1400 W |
| Pressure: | 2 Torr |
| Time: | 50 sec |
| Sacrificial Layer Removal | |
| Reactor: | Applied Materials DPS Metal Etch Chamber |
| Step 1: Stabilization | |
| BC13 Source Flow: | 60 sccm |
| C12 Source Flow: | 40 sccm |
| N2 Source Flow: | 0 sccm |
| RF Power: | 0 W |
| Pressure: | 7 mTorr |
| Time: | 15 sec |
| Step 2: Metal Etch | |
| BC13 Source Flow: | 60 sccm |
| C12 Source Flow: | 40 sccm |
| N2 Source Flow: | 0 sccm |
| Top RF Power: | 500 W |
| Bottom Power: | 120 W |
| Pressure: | 7 mTorr |
| Time: | 25 sec |

After the free standing sidewalls have been formed, the wafers are spray rinsed and spun dry. This causes the sidewalls to curl outward from the metal lines to form arches between adjacent metal lines. Alternatively, a DNS Megasonic Clean can be used during this post-etch clean up process. The overlying dielectric layer can then be deposited using an Applied Materials P5000 Mark II chamber at a susceptor temperature of 400 degrees C. The following data gives results from actual test runs during a PETEOS deposition process.

| PETEOS Deposition | |
|---|---|
| Step 1: Gas Stabilization | |
| O2 Source Flow: | 800 sccm |
| He Source Flow: | 1400 sccm |
| RF Power: | 0 W |
| Pressure: | 8.2 Torr |
| Time: | 10 sec |
| Step 2: TEOS | |
| O2 Source Flow: | 800 sccm |
| He Source Flow: | 1400 sccm |
| TEOS: | 1050 mgm |
| Susceptor Spacing: | 250 mill |
| RF Power: | 0 W |
| Pressure: | 8.2 Torr |
| Time: | 10 sec |
| Step 3: Stabilization | |
| O2 Source Flow: | 800 sccm |
| He Source Flow: | 1400 sccm |
| TEOS: | 1000 mgm |
| Susceptor Spacing: | 260 mill |
| RF Power: | 0 W |
| Pressure: | 8.2 Torr |
| Time: | 10 sec |
| Step 4: Deposition | |
| O2 Source Flow: | 800 sccm |
| He Source Flow: | 1400 sccm |
| TEOS: | 1000 mgm |
| Susceptor Spacing: | 250 mill |
| RF Power: | 820 W |
| Pressure: | 8.2 Torr |
| Time: | 39.3 sec (for 1000 nm of SiO2) |
| Step 5: Pump out | |
| Time: | 20 sec |

During the pump out process, there is no gas flow and no power. Subsequently, the dielectric layer (e.g. SiO2) is planarized using a chemical mechanical polishing process which removes approximately 500 nanometers of the dielectric layer.

After this process, the number of electrical shorts seen on dense comb structures was less than one per meter, which meets the specifications for a typical metallization process. The height of the air gap is only slightly greater than that of the metal line, and therefore the thickness of the subsequently deposited interlevel dielectric layer need not be increased. The slight extension of the air gap above the top of the final conductor is advantageous, since the fringing fields (where the electric field is enhanced by geometric effects) fall partly within the air gap, but further upward extension would yield no further benefit.

FIG. 3 shows characterization results, in the form of a TOF-SIMS (time-of-flight/secondary-ion-mass-spectroscopy) chart. The five curves on the TOF-SIMS chart illustrate the depth profile of various chemical species on and near the surface of a sub-micron array of dense metal lines (e.g. 0.35 micron line and space), after the formation of the arches of the sidewall material. This analysis is qualitative in that the y-axis is given in arbitrary units and one curve cannot be compared to another. Each individual curve shows the relative concentration of a particular species at the surface as compared to the concentration of that same species at various depths. The x-axis shows the depth from the surface.

The [CxHyO] concentration is high at the surface and falls off to a low level at a depth of 1.0 nm. Photoresist is the source of carbon, and the relatively high concentration of [CxHyO] at the surface is expected. The B/BO concentration and the [C—N] concentration is high at a depth of 1.0 nm and falls off at a depth of 5.0 nm. BC13, one of the feed gases, is the source of boron, and the relatively high concentrations of B/BO near the surface is expected. The AlOx and Ti/TiO concentrations increase as the depth from the surface increases. Therefore, the bulk of the free-standing sidewall, which forms the arch between adjacent metal lines, is AlOx.

Alternative Embodiment: Single Metal Layer

In this alternative embodiment, the innovative process of the present invention is practiced using a single metal layer for the metallization and sacrificial layers. In a sample implementation of this class of embodiments, aluminum is deposited with a thickness of around 800 nanometers, without a separate sacrificial layer. In order to form air gaps between the metal interconnects, this metal layer is subjected to an anisotropic plasma etch to form a deposit on the sidewalls. Before the overetch is completed the resist is removed, so that when the metal etch is resumed, the last part of the overetch removes metal from all locations. In this sample embodiment approximately 200 nanometers of the metal layer is removed during the last phase of the plasma etch. This frees approximately 200 nm of the sidewall coating to curl outward. A layer of a capping dielectric, such as SiO2, is then deposited over the metal layer and sidewall arches, as described above, to form stable air gaps between adjacent metal lines.

Alternative Embodiment: Added Sidewall Coating

In alternative embodiments, it is contemplated that the partial arches over the gaps 295 can be provided by a very thin deposited layer (alone or in combination with the sidewall residues), which is preferably less than 20 nm thick. For example, silicon nitride can be used for this. The sidewall material must permit highly conformal deposition, and should be able to withstand an etch which removes the sacrificial layer. In this case the material can be selected to provide an inherent mechanical stress which causes it to curl outward to form the arches.

Alternative Embodiment: Other Sacrificial Layers

Note that the upper metal layer is merely a sacrificial layer, and in an alternative embodiments other sacrificial layers can be used instead. Such other layers can be, for example, an organic polymer such as polyimide, with a thin deposited nitride sidewall.

Alternative Embodiment: Full Arches

In the preferred embodiment, the extended sidewall residues do not actually meet. (This is preferred, to avoid a possible leakage path.) However, in alternative embodiments, the sidewall residues can be compelled to meet, by using a thicker sacrificial layer and/or by varying the spray pressure used during the rinse process.

Alternative Embodiment: Silicon

Anisotropic etching of silicon also typically produces a sidewall residue, which can be used to form air gaps within the structure by performing the plasma etch and rinse process described herein to form arches and then depositing a dielectric layer over the structure. This can be advantageous in fabrication of densely-packed DRAM word lines.

According to a disclosed class of innovative embodiments, there is provided: an integrated circuit metallization fabrication method, comprising the steps of: (a.) depositing a sacrificial layer atop a metal layer; (b.) etching through said sacrificial layer and said metal layer in selected locations to form metal lines, while forming a sidewall coating on said sacrificial layer and said metal layer; (c.) at least partially removing said sacrificial layer, and causing said sidewall coating to curl laterally outward from the sides of said metal layer to form a partial or complete arch between adjacent ones of said metal lines; and (d.) depositing a dielectric layer overall to form air gaps between adjacent ones of said metal lines; whereby capacitive coupling between adjacent ones of said metal lines is reduced.

According to another disclosed class of innovative embodiments, there is provided: a method of forming air gaps within an integrated circuit structure, comprising the steps of: (a.) providing a partially fabricated integrated circuit structure, and depositing a metal layer thereon; (b.) depositing a sacrificial layer atop said metal layer, said sacrificial layer being composed of the same material as said metal layer, said sacrificial layer and said metal layer being separated by an etch stop; (c.) etching through said sacrificial layer and said metal layer in selected locations to form metal lines, while forming a sidewall coating on said sacrificial layer and said metal layer; (d.) at least partially removing said sacrificial layer, and causing said sidewall coating to curl laterally outward from the sides of said metal layer to form a partial or complete arch between adjacent ones of said metal lines; and (e.) depositing a dielectric layer overall to form a capping layer; whereby air gaps laterally separate adjacent ones of said metal lines to reduce the capacitive coupling between said adjacent ones of said metal lines.

According to another disclosed class of innovative embodiments, there is provided: An integrated circuit, comprising: a substrate having a patterned metal layer thereon; wherein adjacent lines of said metal layer are laterally separated by gaps having no solid material therein; said gaps having a cross-sectional area at least 50 percent of the cross-sectional area of said lines of said metal layer; whereby said gaps provide reduced capacitive coupling between adjacent lines of said metal layer.

According to another disclosed class of innovative embodiments, there is provided: An integrated circuit, comprising: a substrate having a patterned metal layer thereon; wherein adjacent lines of said metal layer are laterally separated by gaps having no solid material therein; wherein there is less than 20 nm of dielectric material on the sidewalls of said lines of said metal layer; whereby said gaps provide reduced capacitive coupling between adjacent lines of said metal layer.

According to another disclosed class of innovative embodiments, there is provided: An integrated circuit, comprising: a substrate having a patterned metal layer thereon; wherein adjacent lines of said metal layer are laterally separated by gaps having no solid material therein; arches of a first dielectric material which partially cover said gaps; and a layer of a second dielectric material overlying said arches and closing said gaps, said second dielectric material having a composition different than said first dielectric material; whereby said gaps provide reduced capacitive coupling between adjacent lines of said metal layer.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

It will be readily recognized that the disclosed inventions are equally applicable to processes with multiple layers of metal (and in fact would be most commonly used in such processes). Similarly, it will be readily recognized that the described process steps can also be embedded into hybrid process flows, such as BiCMOS or smart-power processes.

While this method has been particularly demonstrated with an aluminum metallization, the applicability is not limited to aluminum, but can also be applied to other thin film conductors. For example, tungsten or copper etching also typically produces a sidewall residue.

In embodiments where the same material as the metallization is used as the sacrificial layer, the chemistry can be adjusted, as it was with the aluminum embodiment described above, to provide additional sidewall residue formation during the primary pattern etch.

Of course a wide variety of materials, and of combinations of materials, can be used to implement the metal layer. Additionally, the specific etch chemistries, layer compositions, and layer thicknesses given are merely illustrative, and do not by any means delimit the scope of the claimed inventions.

The invention can also be adapted to other combinations of dielectric materials in the interlevel dielectric. For example, phosphosilicates, germanosilicate, arsenosilicates or combinations thereof can be used instead of the SiO2 of the presently preferred embodiment.

The innovative process teachings may also be adapted for contact formation in bipolar or other device technologies.

What is claimed is:

1. An integrated circuit metallization fabrication method, comprising the steps of:
    (a.) depositing a sacrificial metal layer atop a metal layer;
    (b.) etching through said sacrificial layer and said metal layer in a common pattern to form metal lines, while forming a sidewall coating on said sacrificial layer;
    (c.) at least partially removing said sacrificial layer, and causing said sidewall coating to curl laterally outward from the sides of said metal layer to form a partial or complete arch between adjacent ones of said metal lines; and
    (d.) depositing a dielectric layer overall to form air gaps between adjacent ones of said metal lines;
    whereby capacitive coupling between adjacent ones of said metal lines is reduced.

2. The method of claim 1, wherein said sidewall coating is an insulator.

3. The method of claim 1, wherein said metal is aluminum, and said step of etching is performed using a source gas containing boron, nitrogen and chlorine.

4. The method of claim 1, wherein said step of removing said sacrificial layer and causing said sidewall coating to curl is performed using a plasma etch and rinse processes.

5. A method of forming air gaps within an integrated circuit structure, comprising the steps of:
    (a.) providing a partially fabricated integrated circuit structure, and depositing a metal layer thereon;
    (b.) depositing a sacrificial metal layer atop said metal layer, said sacrificial layer being composed of the same material as said metal layer, said sacrificial layer and said metal layer being separated by an etch stop;
    (c.) etching through said sacrificial layer and said metal layer in selected locations to form metal lines, while forming an insulating sidewall coating on said sacrificial layer and said metal layer;
    (d.) at least partially removing said sacrificial layer, and causing said sidewall coating to curl laterally outward from the sides of said metal layer to form a partial or complete arch between adjacent ones of said metal lines; and
    (e.) depositing a dielectric layer overall to form a capping layer;

whereby air gaps laterally separate adjacent ones of said metal lines to reduce the capacitive coupling between said adjacent ones of said metal lines.

6. The method of claim 5, wherein said metal is aluminum, and said step of etching is performed using a source gas containing boron, nitrogen and chlorine.

7. The method of claim 5, wherein said step of removing said sacrificial layer and causing said sidewall coating to curl is performed using a plasma etch and rinse process.

* * * * *